United States Patent [19]

Suzuki

[11] Patent Number: 5,179,777
[45] Date of Patent: Jan. 19, 1993

[54] METHOD OF MAKING MULTILAYER PRINTED WIRING BOARDS
[75] Inventor: Toshiya Suzuki, Tokyo, Japan
[73] Assignee: NEC Corporation, Japan
[21] Appl. No.: 840,032
[22] Filed: Feb. 24, 1992
[30] Foreign Application Priority Data Mar. 7, 1991 [JP] Japan .................. 3-040401

[51] Int. Cl.$^5$ ............................... H05K 3/10
[52] U.S. Cl. ...................... 29/848; 29/830; 156/902; 428/901
[58] Field of Search .......... 29/830, 846, 848; 428/901; 156/902; 361/408, 414

[56] References Cited

U.S. PATENT DOCUMENTS

| | | | |
|---|---|---|---|
| 4,075,757 | 2/1978 | Malm et al. | 756/902 X |
| 4,287,014 | 9/1981 | Gaku et al. | 29/830 X |
| 4,311,749 | 1/1982 | Hiraiwa et al. | 428/901 X |
| 4,496,793 | 1/1985 | Hanson et al. | 29/830 X |
| 4,584,039 | 4/1986 | Shea | 156/902 X |
| 4,668,332 | 5/1987 | Ohnuki et al. | 29/846 X |
| 4,780,957 | 11/1988 | Shiga et al. | 29/830 |
| 4,854,038 | 8/1989 | Wiley | 29/830 |
| 5,031,308 | 7/1991 | Yamashita et al. | 29/830 |

Primary Examiner—Carl J. Arbes
Attorney, Agent, or Firm—Laff, Whitesel, Conte & Saret

[57] ABSTRACT

A method of making a multilayer printed wiring board is provided in which a filler material to be used for filling a clearance/clearances of a patterned conductive layer formed on an internal plate therewith is prepared, then, the filler material thus prepared is disposed between the internal plate and a prepreg sheet so as to correspond respectively to the clearance/clearances, and the internal plate and an external plate are laminted via the prepreg sheet and filler material thus disposed thereby to be adhered integrally to each other. The filler material is preferable to be filmily adhesively provided on one surface of the prepreg sheet by a screen printing method. As the material for this purpose, it is preferable to use a material which behaves similarly to the prepreg sheet and further preferable to use the same material as that of the prepreg sheet.

5 Claims, 2 Drawing Sheets (PRIOR ART)

METHOD OF MAKING MULTILAYER PRINTED WIRING BOARDS

BACKGROUND OF THE INVENTION

1. Field of the Invention

This invention relates to a method of making multilayer printed wiring boards and more particularly, to a method of making multilayer printed wiring boards in which internal plates each having a conductive circuit formed on its one or both surfaces are laminated via a sheet-like prepreg.

2. Description of the Prior Art

A method of making a multilayer printed wiring board of the prior art is shown in FIGS. 1 and 2, in which a four-layer board is illustrated for the sake of simplification of explanations. As shown in FIG. 1, first, a conductive layer 12 is patterned on the both surfaces of a plate-like insulating plate to form a conductive circuit, thus obtaining an internal plate 11. Each of the conductive layers 12 of the internal plate 11 has a clearance 13a or a portion where the conductive layer 12 is partially removed by patterning. The clearance 13a are partially provided so as to be densely aggregated to form a clearance aggregation section 13.

Next, on each of the both surfaces of the internal plate 11 is laminatedly placed a copper foil 15 via a prepreg sheet 14. The laminated body thus formed of the internal plate 11, prepreg sheet 14 and copper foil 15 is placed in a mold, and heated under the application of a pressure to have them integrally adhered. Thus, a multilayer printed wiring board 10 as shown in FIG. 2 is obtained.

The multilayer printed wiring board 10 thus obtained has recess portions A in the copper foil 15 respectively just above and under the clearance aggregation sections 13. This is because the prepreg sheet 14 goes into the clearance 13a of the conductive layer 12 when heated under the application of a pressure thereby to form a recess portion in the prepreg sheet 14 itself as to be similar to the recess portion A. The recess portion A is also formed in the other sections than the clearance aggregation section 13, however the depth of them to be formed in the former is small as compared with that formed in the latter. As a result, the multilayer printed wiring board 10 thus obtained will become unstable in thickness characteristic and at the same time, the spatial distance between the conductive layer 12 and copper foil 15 will become non-uniform, which means that such a problem is arisen that a through-hole may be disconnected in the plating process as well as a packaged electronic part may be dispersed in electric property.

Thus, an object of this invention is to provide a method of making a multilayer printed wiring board by which a multilayer printed wiring board having a uniform thickness and flat external surfaces as well as having a constant space between the adjacent conductive layers can be obtained even if a patterned conductive layer of an internal plate has a clearance.

SUMMARY OF THE INVENTION

A method of making a multilayer printed wiring board of this invention features that a filler material is prepared with which a clearance or clearances of a patterned conductive layer of an internal plate are to be filled, then, the filler materials thus prepared are disposed between the internal plate and a sheet-like prepreg so as to correspond respectively to the clearance/clearances, and thereafter, the internal plate and an external plate are laminated via the prepreg and filler material thereby to be adhered integrally to each other. The filler material is generally disposed correspondingly to a portion where the clearance/clearances is/are largely aggregatively formed in the conductive layer, but may be further additionally disposed at any portion where the aggregation of them is not so large. In case that the conductive layer has the clearance distributions different in aggregation degree from each other, the disposal of the filler material is made in accordance with the state of such clearance distributions.

The filler material may be adhesively disposed on either the conductive layer or the prepreg, but it is preferable to be filmily adhered onto one surface of the prepreg correspondingly to each of the clearances. In this case, as the filler material, it is preferable to use a material which behaves similarly to the prepreg, and further preferable to use the same material as that of the prepreg. The prepreg serves to adhere them to each other while maintaining interlayer insulation and interlayer distance, so that the material to be used for the filler is selected from the group consisting of such materials as to do so. As the prepreg, a polyimide resin, bismaleimido triazine (BT) resin or the like can be used.

As a method of forming a filler film, various methods which can be used in such a field of technology can be applied, however, a screen printing method is preferable to be used from the viewpoint of the requirements such as positional and size accuracy and the like. In this case, however, the filler film or sheet may be separately formed and disposed.

DESCRIPTION OF THE PREFERRED EMBODIMENT

One preferred embodiment of this invention will be explained below while referring to FIGS. 3 and 4. For the sake of simplification of the explanations, a four-layer board is illustrated.

Figure 1:
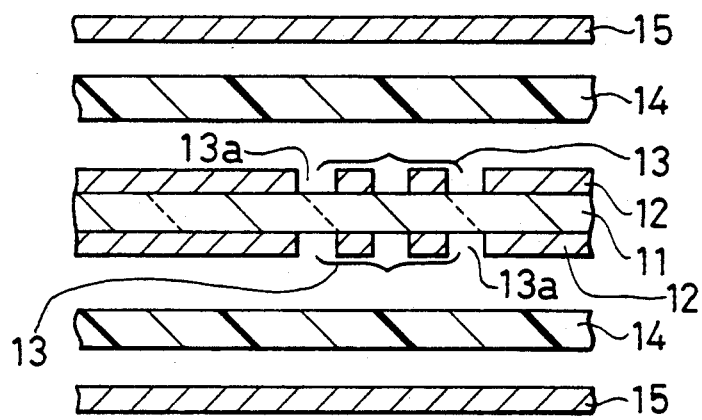
FIG. 1 cross-sectionally illustrates a method of making a multilayer printed wiring board of the prior art.
Figure 2:
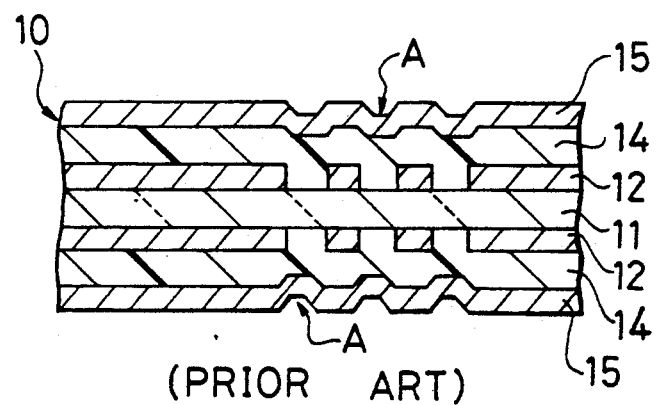
FIG. 2 cross-sectionally illustrates a multilayer printed wiring board made by the method shown in FIG. 1.
Figure 3:
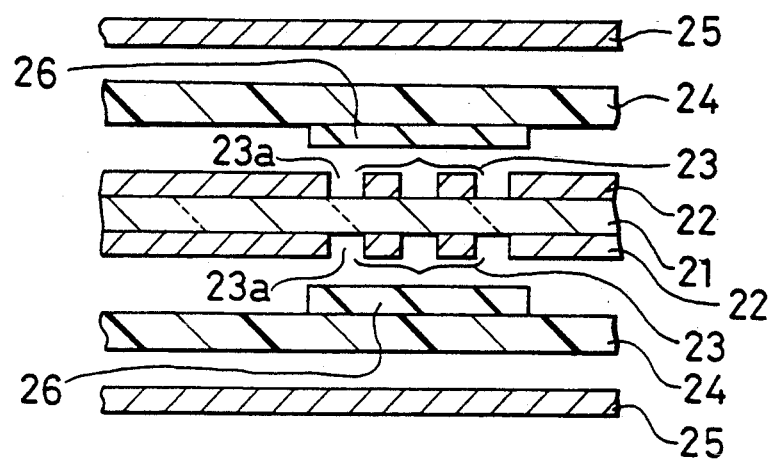
FIG. 3 cross-sectionally illustrates a method of making a multilayer printed wiring board according to one embodiment of this invention.

As shown in FIG. 3, first, conductive layers 22 formed on the both surfaces of a plate-like insulating material are patterned to form a predetermined conductive circuit, thus obtaining an internal plate 21. Each of the conductive layer 22 of the internal plate 21 has a large number of clearances 23a with no existence of the conductive layer 22. The clearances 23a are existed variously in aggregation degree, and in FIG. 3 is shown such a clearance aggregation section 23 that has the highest degree of aggregation of the clearances 23a.

Next, on one surface of each of sheet-like prepregs 24 to be adjacently disposed respectively onto the both surfaces of the internal plate 21, a filler film 26 is formed by a screen printing method to be adhered thereto. In this case, the filler film 26 is formed on the surface of each of the prepreg sheets 24 in such a manner that is confronted to the surface of the conductive layer 22 as well as is corresponded to the clearance aggregation section 23. In this embodiment, a polyimide resin superior in heat resistance is used for the prepreg sheet 24 and as a result, the same polyimide resin is used for the filler film 26. Next, copper foils 25 are laminatedly placed via the prepreg sheets 24 having the filler films 26 respectively on the both surfaces of the internal plate 21. The laminated body thus obtained is placed in a mold to be integrally adhered to each other by heating under the application of a pressure. During which, the prepreg sheet 24 becomes a viscous fluid by heating and is gradually cured with time, thus finishing adhering the internal plate 21 with the copper foil 25. Simultaneously, the filler film 26 made of the same material as that of the prepreg sheet 24 goes into the clearance 23a of the conductive layer 22 to fill them and is cured with time to integrate with the prepreg sheet 24.

Figure 4:
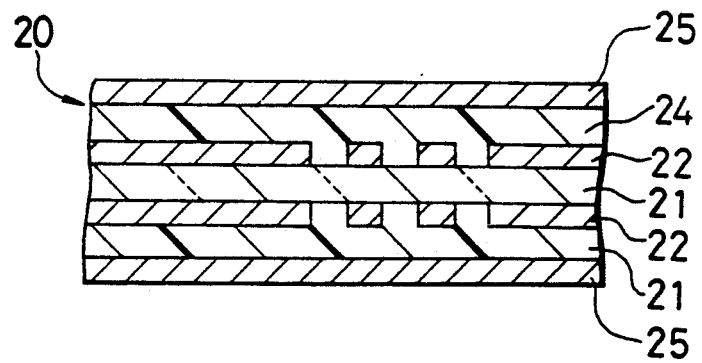
FIG. 4 cross-sectionally illustrates a multilayer printed wiring board made by the method according to this invention shown in FIG. 3.

Thus, a multilayer printed wiring board 20 as shown in FIG. 4 is obtained, which fills the clearances 23a formed in the conductive layer 22 with the filler material when heated under the application of a pressure, so that there can result in no existence of the recess portion formed in the surface of the copper foil 25 just above and under the clearance aggregation section 23 and at the same time, the distance between the internal plate 21 and the copper foil 25 can be made constant. In this embodiment, the filler film 26 is formed of the same material as that of the prepreg sheet 24, resulting in no adverse influence due to the filler material to be used.

The thickness and size of the filler film 26 are appropriately determined by giving considerations upon the depth and size of the clearance 23a as well as upon the aggregation degree thereof in order that the wiring board 20 can be made uniform in thickness between the clearance aggregation section 23, the section where the number of the clearances 23a to be formed are comparatively small and the section where the clearance 23a is not formed, and that the space between the conductive layer 22 and the copper foil 25 can be made constant. In addition, in case that the conductive layer 22 has a plurality of clearance aggregation sections 23 different in aggregation degree of the clearance 23a from each other, it is preferable to control the thickness and/or size (area) of the filler film 26 to be formed correspondingly to the clearance aggregation section 23 in accordance with the clearance aggregation degree.

In addition, in this embodiment, the internal plate 21 is used one but not limited thereto, it is needless to say that it can be used two or more.

As described above, according to this invention, the clearance aggregation sections 23 of the conductive layer 22, or the sections where the conductive layer 22 is partially removed are filled with a filler material, so that the laminated body can be uniformly pressurized when to be integrally adhered. As a result, the through-hole disconnection caused by the plating process and the dispersion in electric property of a packaged part as shown in the prior art can be effectively prevented.

What is claimed is:

1. A method of making a multilayer printed wiring board including an internal plate having a patterned conductive layer formed on at least one surface of an insulating material and an external plate laminatedly formed via a sheet-like prepreg on the internal plate, comprising;

a first step of preparing a filler material to be filled into a clearance of said conductive layer;

a second step of disposing said filler material between said internal plate and said prepreg so as to correspond respectively to said clearance of said conductive layer; and a third step of laminating said internal plate via said prepreg and said filler material with said external plate thereby to be adhered integrally to each other.

2. A method of making a multilayer printed wiring board as claimed in claim 1, wherein said filler material is a film adhered onto one surface of said prepreg.

3. A method of making a multilayer printed wiring board as claimed in claim 2, wherein said filler film is formed by a screen printing method.

4. A method of making a multilayer printed wiring board as claimed in claim 1, wherein such a material that behaves similarly to said prepreg is used as said filler material.

5. A method of making a multilayer printed wiring board as claimed in claim 4, wherein the material of said filler is same as that of said prepreg.

* * * * *